(12) United States Patent
Suzuki (10) Patent No.: US 6,509,584 B2
(45) Date of Patent: Jan. 21, 2003

(54) OPTICAL UNIT INCORPORATING LIGHT-EMITTING OR LIGHT-RECEIVING ELEMENT COATED BY RESIN PROTECTOR

(75) Inventor: Nobuaki Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/014,978

(22) Filed: Dec. 10, 2001

(65) Prior Publication Data

US 2002/0088981 A1 Jul. 11, 2002

(30) Foreign Application Priority Data

Dec. 11, 2000 (JP) .................................. 2000-375439

(51) Int. Cl.[7] .................... H01L 21/00; H01L 33/00
(52) U.S. Cl. ..................... 257/98; 438/22; 438/29
(58) Field of Search ..................... 257/20, 80–83, 257/433, 435, 84, 98, 99, 100; 438/29, 22–28

(56) References Cited

U.S. PATENT DOCUMENTS

| 5,436,472 A | 7/1995 | Ogawa |
| 5,455,199 A | 10/1995 | Sakamoto |
| 5,959,316 A | * 9/1999 | Lowery .................. 257/98 |

* cited by examiner

*Primary Examiner*—Olik Chaudhuri
*Assistant Examiner*—(Vikki) Hao B. Trinh
(74) *Attorney, Agent, or Firm*—Merchant & Gould P.C.

(57) ABSTRACT

A light-emitting unit includes an LED, a lead on which the LED is mounted, and a transparent protector covering the LED. The lead is formed with a dent to accommodate the LED. The dent includes a bottom surface to which the LED is attached and a side surface extending from the bottom surface in a flaring manner. The side surface of the dent is formed with at least one opening so that it avoids encircling the LED completely.

10 Claims, 9 Drawing Sheets

OPTICAL UNIT INCORPORATING LIGHT-EMITTING OR LIGHT-RECEIVING ELEMENT COATED BY RESIN PROTECTOR

BACKGROUND OF THE INVENTION

1. Field of the Invention

The present invention relates to an optical unit incorporating an optical element such as a light-emitting diode or phototransistor. The present invention also relates to a photo-interrupter utilizing such an optical unit.

2. Description of the Related Art

Figure 11:
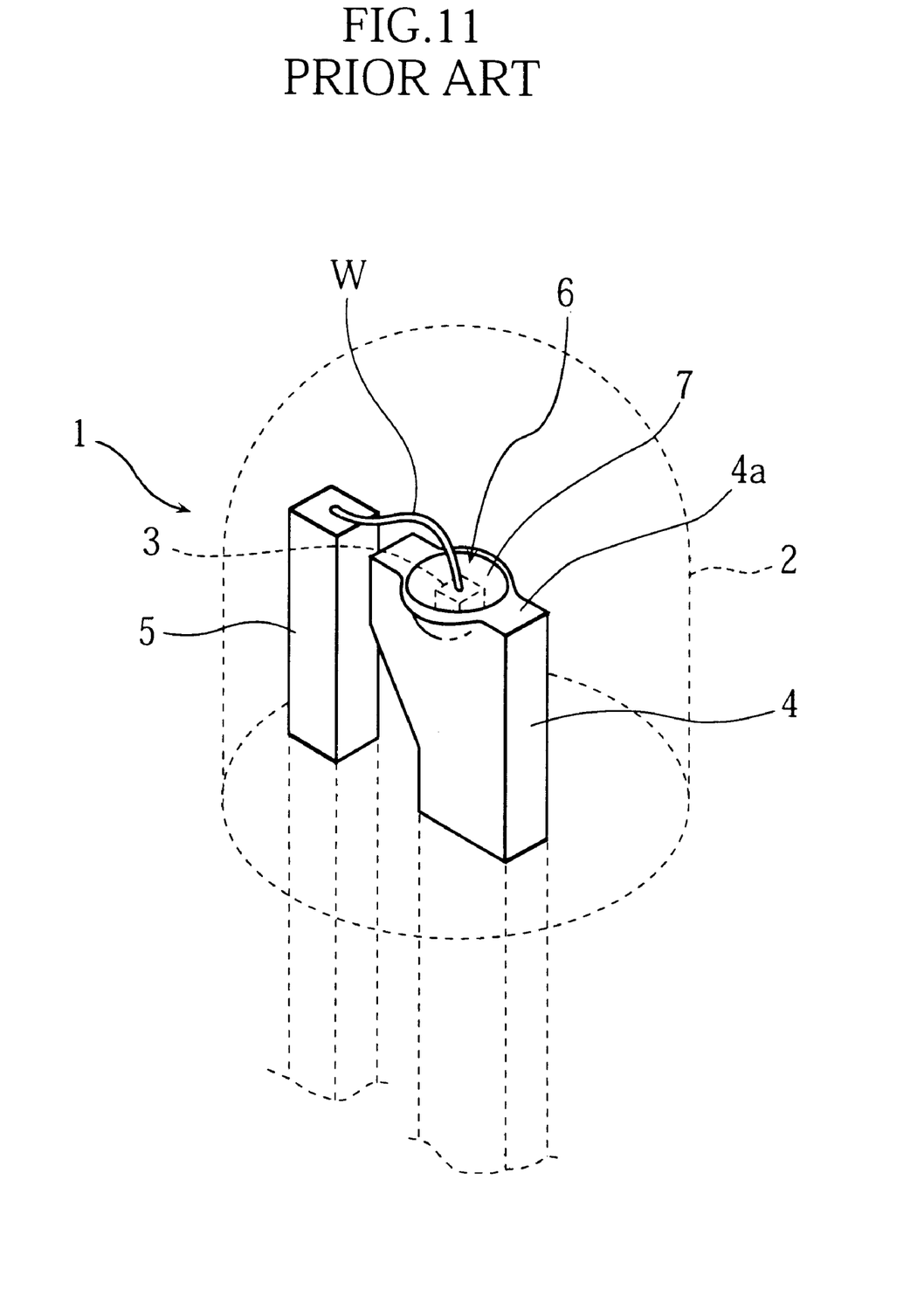
FIG. 11 is a perspective view showing a conventional LED device.
Figure 12:
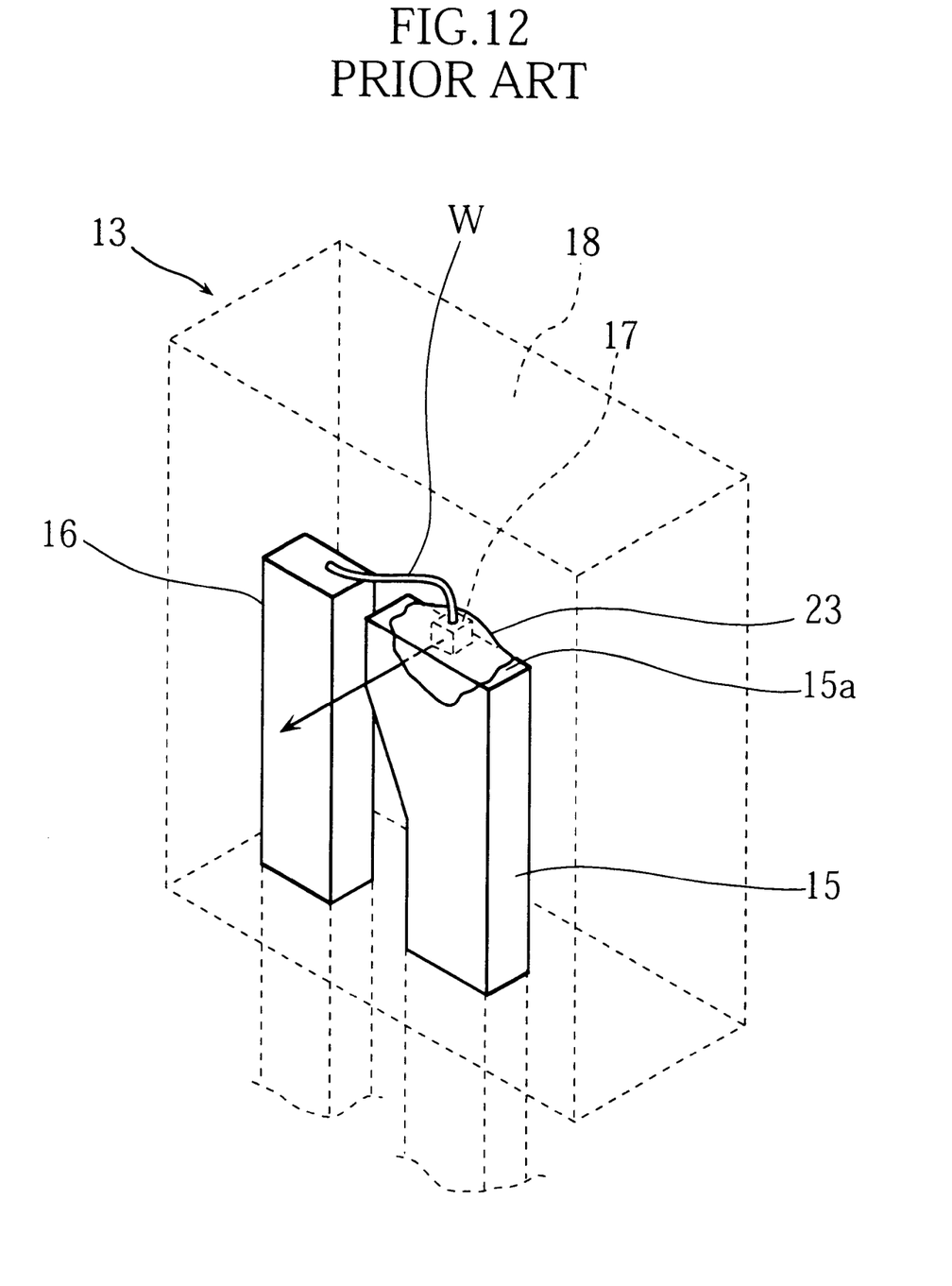
FIG. 12 is a perspective view showing another type of conventional LED device.

FIGS. 11 and 12 of the accompanying drawings show two different types of conventional LED devices. The one shown in FIG. 11 incorporates a surface-emitting LED, while the other shown in FIG. 12 incorporates a non-surface-emitting LED.

Specifically, the device 1 shown in FIG. 11 includes a domed resin package 2 in which a light-emitting element 3 is incorporated. The element 3 is mounted on a first lead 4 in electrical conduction therewith. The element 3 is connected to a second lead 5 by a wire W. The first lead 4 has an upper end 4a in which a cuplike recess 6 is formed to accommodate the element 3. The wall surface of the recess 6 is reflective so that the light emitted from the element 3 is effectively directed upward. At the recess 6, a transparent protector 7 is provided. The protector 7 is formed by pouring gelatinized silicone into the recess 6 and then solidifying it. Even in a semi-fluid state, the applied silicone is properly retained at the upper end of the lead 4 due to the cuplike recess 6.

As in the above-described device 1, the other device 13 shown in FIG. 12 includes a first lead 15, a second lead 16, a light-emitting element 17 mounted on the first lead 15, and a wire W connecting the element 17 to the second lead 16. Numeral 18 refers to a resin package. In the device 13, light is emitted laterally from a side surface of the element 17, as indicated by an arrow. Thus, differing from the above device 1, the light-emitting element 17 of the device 13 is not put in a cuplike recess, but put on the flat end surface 15a of the lead 15 to allow the emitted light to travel undisturbed.

As in the above device 1, the element 17 of the device 13 is covered by a resin protector 23 made by applying gelatinized silicone resin. However, in the device 13, no special measures are taken for retention of the applied resin material. Thus, the applied material may spread unduly over the upper end surface 15a of the lead 15 and even dribble down the lead 15. If this happens, the resulting protector 23 is formed by an insufficient amount of resin material, thereby failing to enclose the element 17 properly.

SUMMARY OF THE INVENTION

The present invention has been proposed under the circumstances described above. It is, therefore, an object of the present invention to provide a simple, but effective countermeasure for the above problems.

According to a first aspect of the present invention, there is provide an optical unit which includes: an optical element; a lead including an end surface, the end surface being formed with a dent in which the optical element is placed; and a protector enclosing the optical element. The dent includes both a bottom surface supporting the optical element and a side surface connected to the bottom surface. The side surface is formed with an opening to avoid complete encircling of the optical element.

Preferably, the bottom surface of the dent may be greater in width than the end surface of the lead.

Preferably, the optical unit of the present invention may further include a resin package enclosing the protector.

Preferably, the bottom surface of the dent may be flat and have a rounded outline.

Preferably, the side surface of the dent may include two slant portions facing each other, wherein the slant portions are arranged to flare out as proceeding away from the bottom surface of the dent.

Preferably, the optical element may include a light-emitting surface which stands perpendicular to the bottom surface of the dent.

Preferably, the optical unit of the present invention may further include an additional lead electrically connected to the optical element.

According to a second aspect of the present invention, there is provided a photo-interrupter which includes: a casing; and an optical unit accommodated in the casing. The optical unit includes an optical element, a lead formed with a dent for placing the optical element in, and a protector enclosing the optical element. The dent is provided with a bottom surface supporting the optical element and with a side surface connected to the bottom surface. The side surface is arranged to avoid complete encircling of the optical element.

According to a third aspect of the present invention, there is provided a method of making an optical unit. The method includes the steps of: forming a first lead and a second lead from a conductive member having a uniform thickness; forming a dent in the first lead, the dent having a bottom surface and a side surface; placing an optical element on the bottom surface of the dent; connecting the optical element to the second lead by a wire; forming a transparent protector for covering the optical element; and forming a resin package for covering the first and the second leads, the wire and the protector. The side surface of the dent is arranged to avoid complete encircling of the optical element.

Preferably, the dent may be formed by subjecting the first lead to coining.

Other features and advantages of the present invention will become apparent from the detailed description given below with reference to the accompanying drawings.

DETAILED DESCRIPTION OF THE PREFERRED EMBODIMENT

The preferred embodiment of the present invention will be described below with reference to the accompanying drawings.

Figure 1:
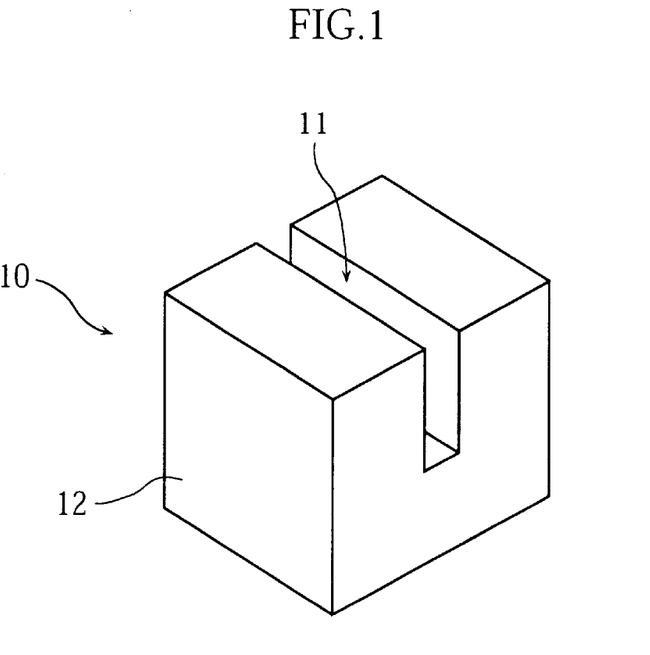
FIG. 1 is a perspective view showing a photo-interrupter embodying the present invention.

FIG. 1 shows the external form of a photo-interrupter (generally designated by numeral 10) according to the present invention. As will be understood from the description given below, the photo-interrupter 10 is only an example to which the present invention is applicable, and there may be many other applications where the present invention can be applied.

Figure 2:
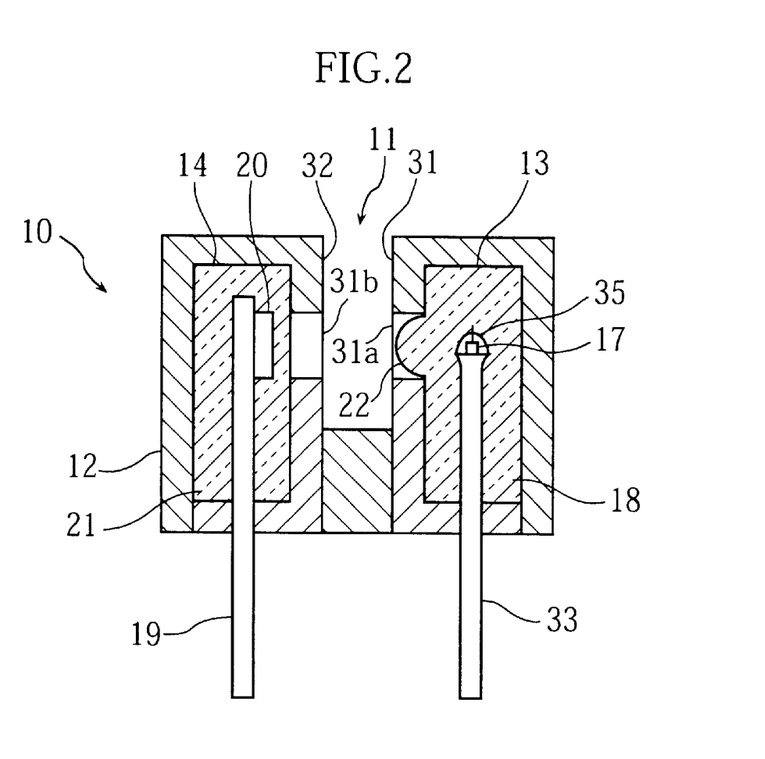
FIG. 2 is a sectional view showing the inside of the photo-interrupter of FIG. 1.

The photo-interrupter 10 includes a casing 12 which may be composed of several parts. The casing 12, having a generally parallelepipedic configuration, is formed with a slit 11. As shown in FIG. 2, the photo-interrupter 10 includes a light-emitting unit 13 and a light-receiving unit 14 separated from the unit 13 by the slit 11. The unit 13 incorporates a light-emitting element 17 such as a GaAlAs-LED, while the unit 14 incorporates a light-emitting element 20 such as a phototransistor.

Across the slit 11, a first surface 31 and a second surface 32 face each other. The first surface 31 is formed with an opening 31a, while the second surface 32 is formed with an opening 32a. In operation, the light emitted from the element 17 passes through the two openings 31a, 32a and is received by the light-receiving element 20.

Figure 3:
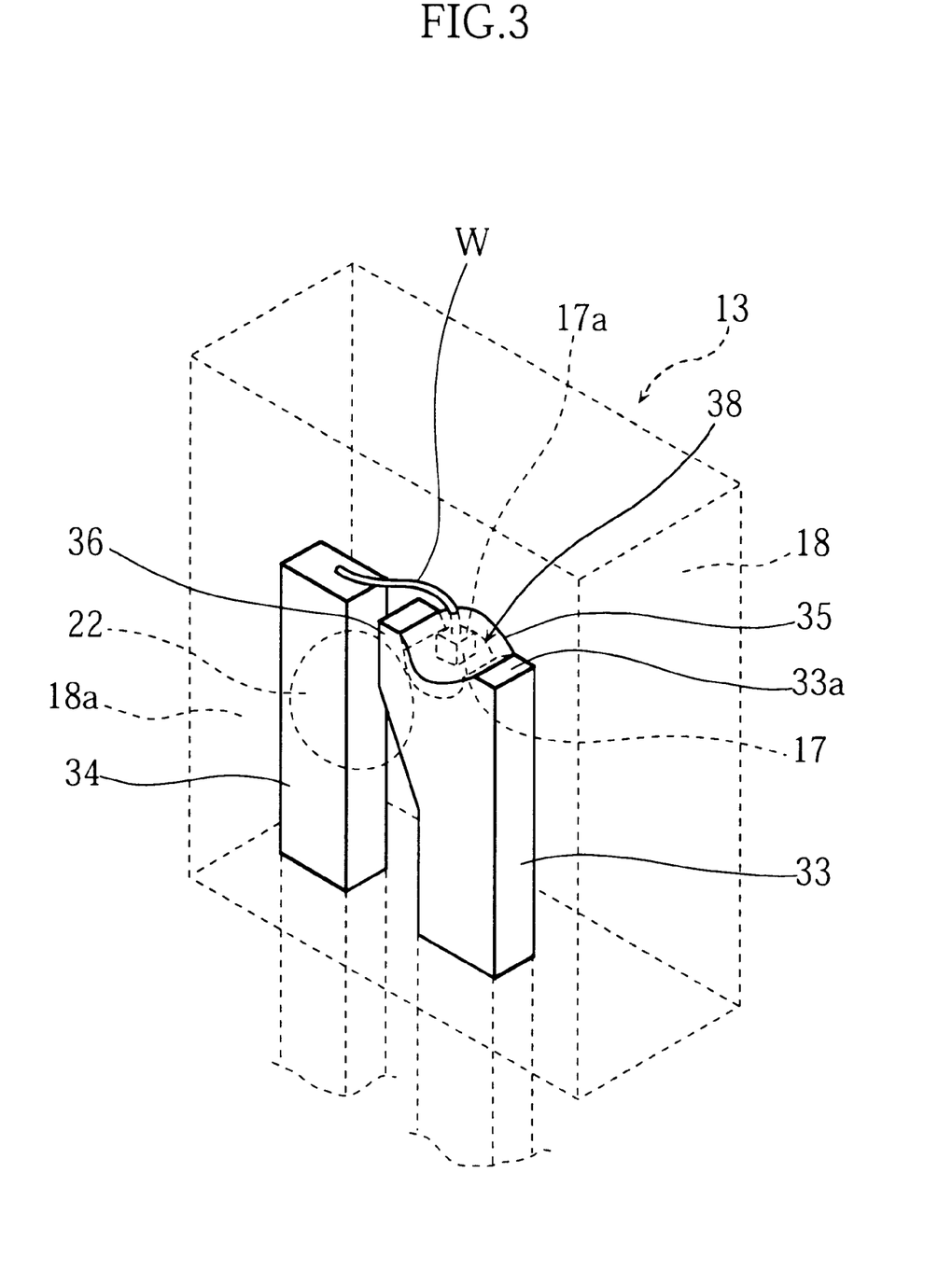
FIG. 3 is a perspective view showing a light-emitting unit used for the photo-interrupter of FIG. 1.

As shown in FIG. 3, the light-emitting unit 13 is provided with a fist lead 33 upon which the light-emitting element 17 is mounted, and a second lead 34 connected to the element 17 by a wire W. The element 17 is enclosed by a transparent protector 35 made of resin. Numeral 18 refers to a resin package to enclose the element 17 (precisely, to enclose the protector 35 which in turn covers the element 17). The package 18 also encloses the wire W and the inner end portions of the two leads 33–34. The protector 35 is provided for preventing the element 17 from being damaged by stress which may be generated in the package 18.

The light-emitting element 17 may be made of GaAlAs material. The element 17 includes a p-type semiconductor layer, a light-emitting layer and an n-type semiconductor layer. The element 17 may further include a positive electrode layer and a negative electrode layer between which the above-mentioned three layers are sandwiched. The element 17 is designed to emit light laterally from its side surface (i.e., non surface-emitting type). The upper surface 17a of the element 17 is provided with an aluminum connection pad which may preferably be gold-plated for improved electrical conduction and stable wire-bonding.

The first lead 33 may be made of 42 alloy (42% Ni—Fe) or copper. The lead 33 consists of two parts: an inner portion enclosed by the package 18 and an outer portion projecting from the package 18. The inner portion of the lead 33 is formed with an extension 36 protruding toward the second lead 34, so that the end surface 33a of the lead 33 is enlarged.

The second lead 34 may also be made of 42 alloy or copper, as in the first lead 33. The second lead 34 consists of an inner portion enclosed by the package 18 and an outer portion projecting from the package 18. The inner portion of the lead 34 is connected to the wire W.

The package 18 may be made of a "transparent" epoxy resin. In this specification, the "transparent" resin does not necessarily mean the one which allows only visible light (about 390 to 740 nm in wavelength) to pass through. When the element 17 is designed to emit infrared rays for instance, the package 18 is described as "transparent" when infrared rays can pass through the package. In this case, the package 18 may or may not allow visible light to pass through. As shown in FIG. 3, the package 18 is provided with a lens 22 in the surface 18a facing the light-receiving unit 14. The lens 22 is provided for focusing the light from the element 17 onto the light-receiving element 20.

Referring to FIG. 2, the light-receiving element 20 is mounted on a lead 19. The element 20 and a part of the lead 19 are enclosed by a resin package 21.

Figure 5:
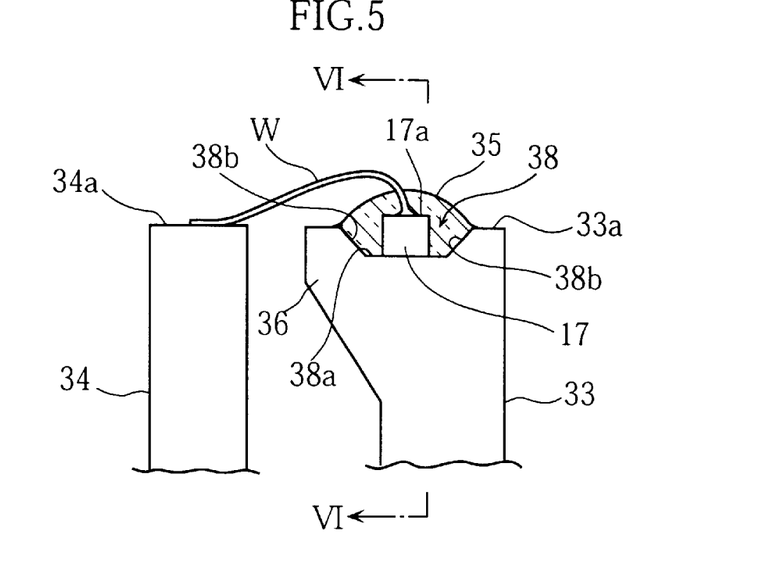
FIG. 5 is a sectional view taken along lines V—V in FIG. 4.

According to the present invention, as best shown in FIG. 5, the end surface 33a of the first lead 33 is provided with a central dent or groove 38 made by coining for example. The dent 38 has a flat bottom surface 38a upon which the light-emitting element 17 is mounted. The dent 38 extends through the thickness of the lead 33 so as not to block the light emitted laterally from the element 17. In the illustrated embodiment, the bottom surface 38a has a rounded outline.

In operation, the light emitted from the element 17 is free to travel through the dent 38, passes through the protector 35, the package 18, the lens 22 and the opening 31a (see FIG. 2), and into the slit 11. When no object is present in the slit 11, the emitted light passes through the opening 31b and through the package 21 of the light-receiving unit 14, to be received by the element 20. When an object is present in the slit 11, the emitted light is blocked, whereby the light does not reach the light-receiving element 20. By monitoring the output signal from the element 20, the presence (or absence) of an object in the slit 11 is detected.

According to the present invention, the light-emitting element 17 is bonded to the flat bottom surface 38a of the dent 38. In this arrangement, the element 17 is held in close contact with the first lead 33, which is advantageous in ensuring good electrical conduction and stable attachment.

Figure 4:
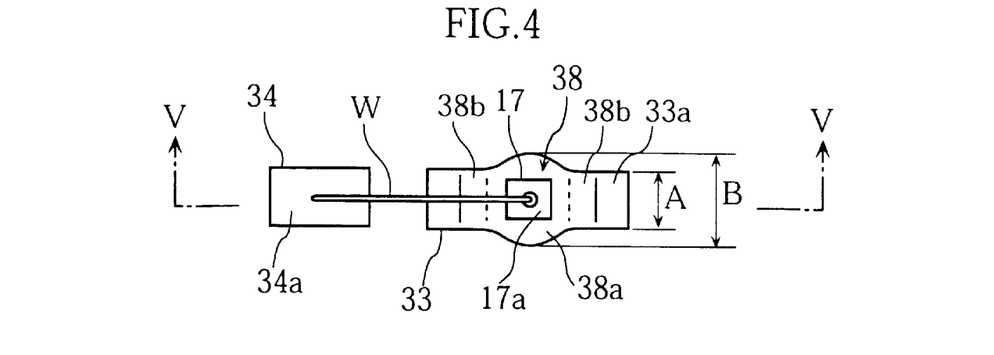
FIG. 4 is a plan view showing the light-emitting unit of FIG. 3, with the resin package omitted.

As shown in FIG. 4, the bottom surface 38a has a width B which is greater than the thickness A of the lead 33. In the illustrated embodiment, the thickness A of the lead 33 is about 0.4 mm.

Due to the large bottom surface 38a, a sufficient amount of molten resin for forming the protector 35 can be applied to the end surface 33a of the lead 33 without allowing the resin material to unduly overflow. In addition, the dent 38 has a pair of slant portions 38b flaring upward (see also FIG. 5) and connected to the bottom surface 38a. This arrangement ensures more stable retention of the applied resin. Accordingly, the protector 35 for enclosing the element 17 is properly formed at the end of the lead 33.

In comparison with the cuplike recess 7 of the conventional optical device shown in FIG. 11, the dent 38 of the present invention can be described as having a side surface (connected to the bottom surface 38a) which is formed with at least one opening (two openings in the illustrated example) to avoid complete encircling of the element 17, so that light emitted from the element 17 is not blocked by the side surface. In the illustrated embodiment, the side surface of the dent 38 consists of two slant portions 38b.

Reference is now made to FIGS. 7–10 illustrating a fabrication method of making the light-emitting unit 13 described above.

Figure 7:
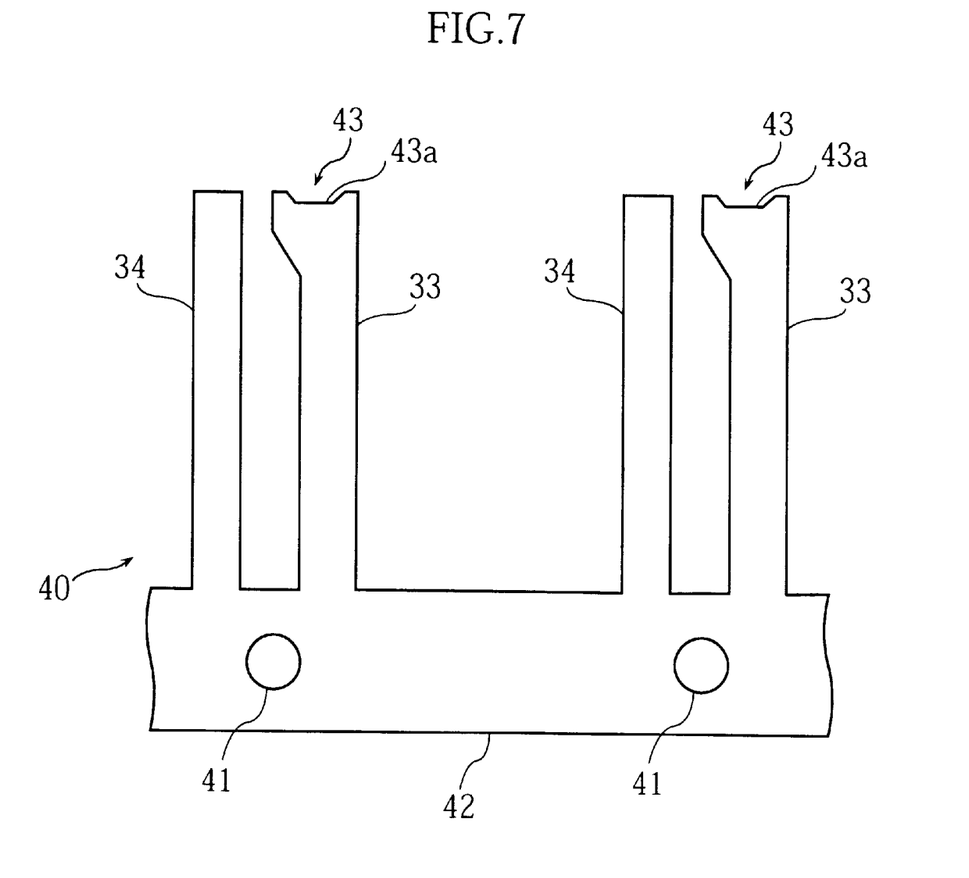
FIGS. 7–10 illustrate a fabrication method of making light-emitting units shown in FIG. 3.

First, a conductive base 40 shown in FIG. 7 is prepared. The base 40 may be obtained by pressing an elongated conductive plate. The base 40 includes a long side band 42 formed with a plurality of indexing holes 41 arranged at regular intervals. The base 40 also includes a plurality of pairs of first and second leads 33, 34 connected to the side band 42 at right angles. Each of the first leads 33 has a free end at which a recess 43 is provided. The recess 43 has a bottom surface 43a.

Figure 6:
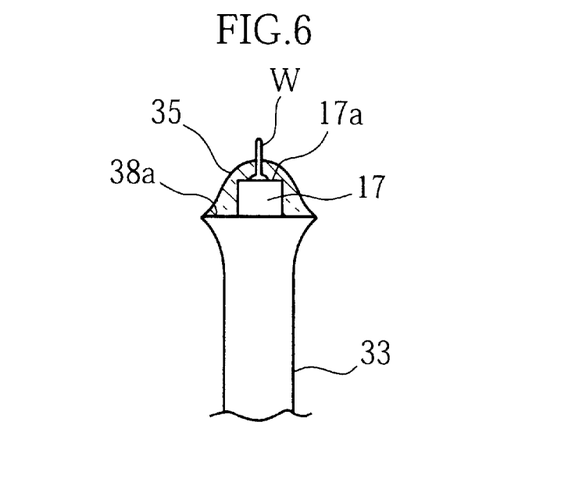
FIG. 6 is a sectional view taken along lines VI—VI in FIG. 5.

Each bottom surface 43a is subjected to a coining process. To this end, use may be made of a metal die (not shown)

having a flat pressing (or coining) surface. The pressing surface of the unillustrated die is brought into pressing contact with the bottom surface 43a, so that a dent 38 is formed, as shown in FIGS. 4–6.

According to the present invention, the first lead 33 may not necessarily be provided with a recess 43 in performing the coining process. With no such preparatory recess, the coining may be performed with respect to a flat end of the lead 33.

Figure 8:
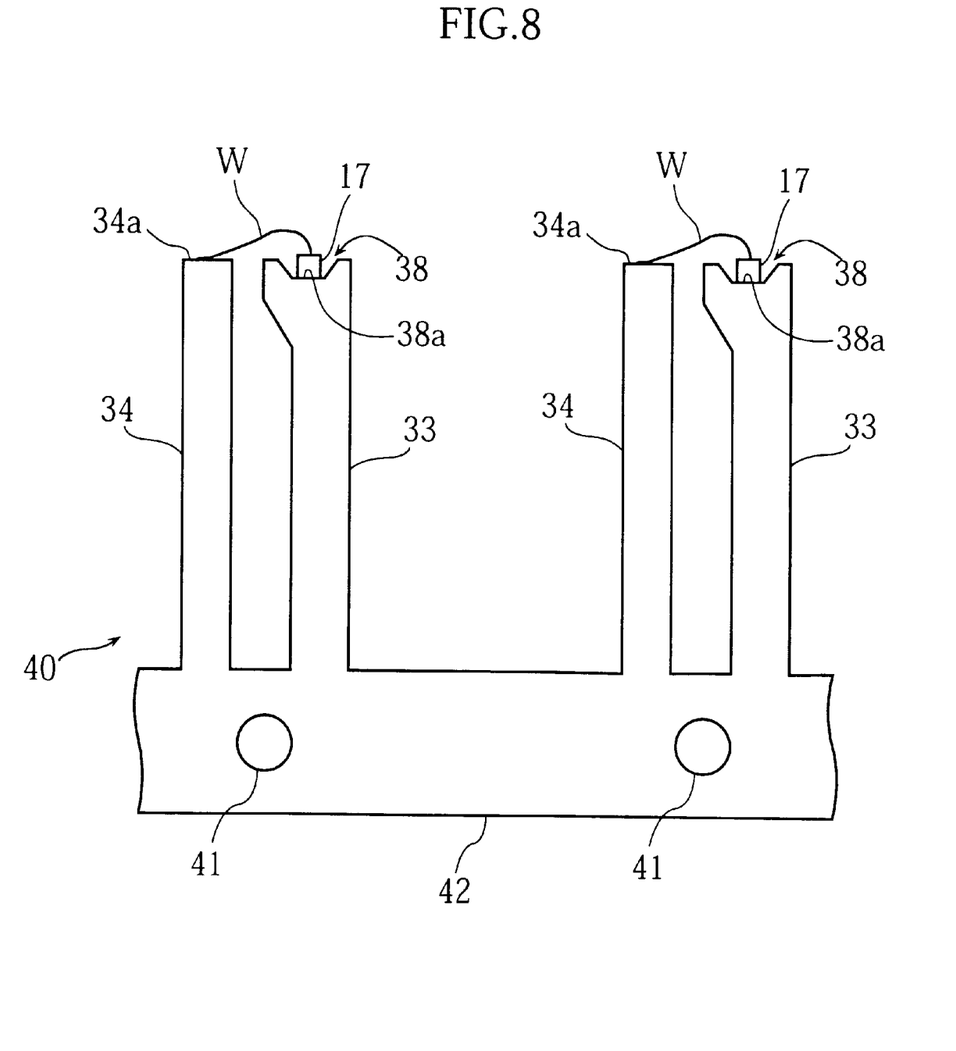

After the coining, as shown in FIG. 8, a light-emitting element 17 is bonded to the bottom surface 38a of a dent 38. Then, a wire W is bonded at one end to the upper surface 34a of the second lead 34 and at the other end to a connection pad (not shown) of the element 17.

Figure 9:
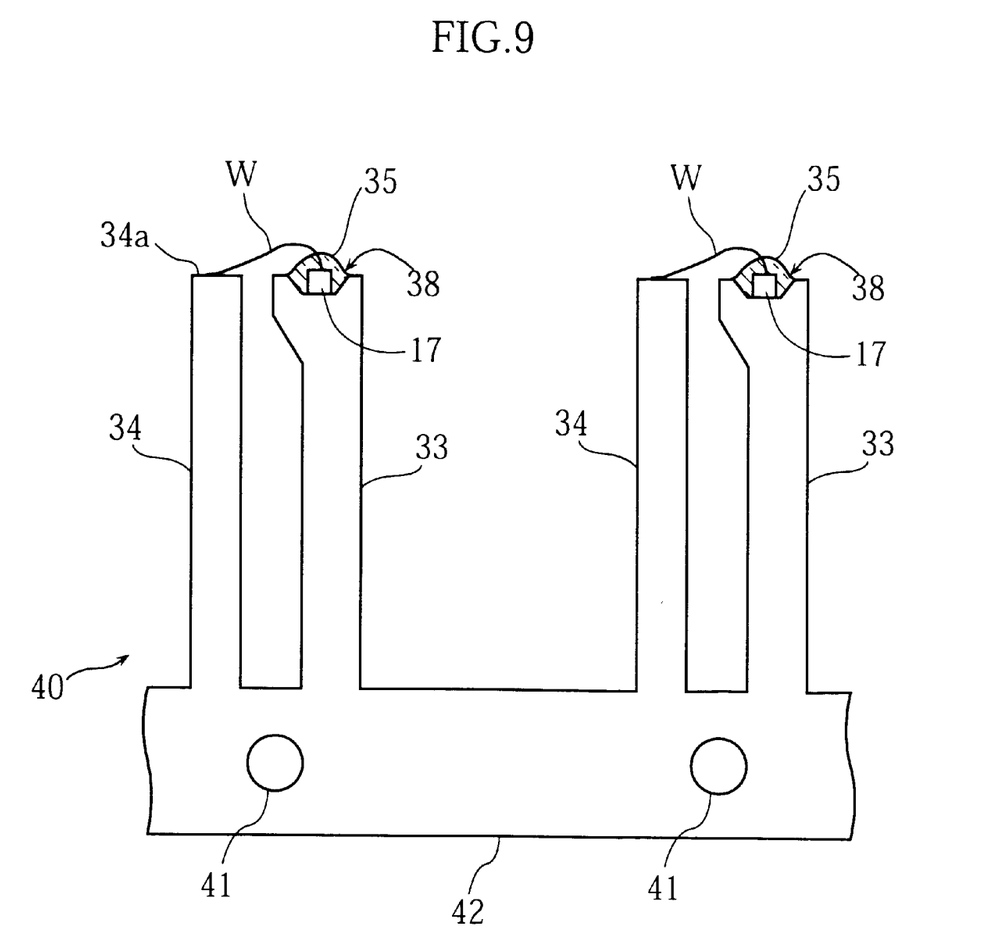

Then, as shown in FIG. 9, gelatinized transparent resin (silicone for example) is applied to the respective dents 38. The applied material is then solidified, thereby serving as protectors 35 for the light-emitting elements 17.

Figure 10:
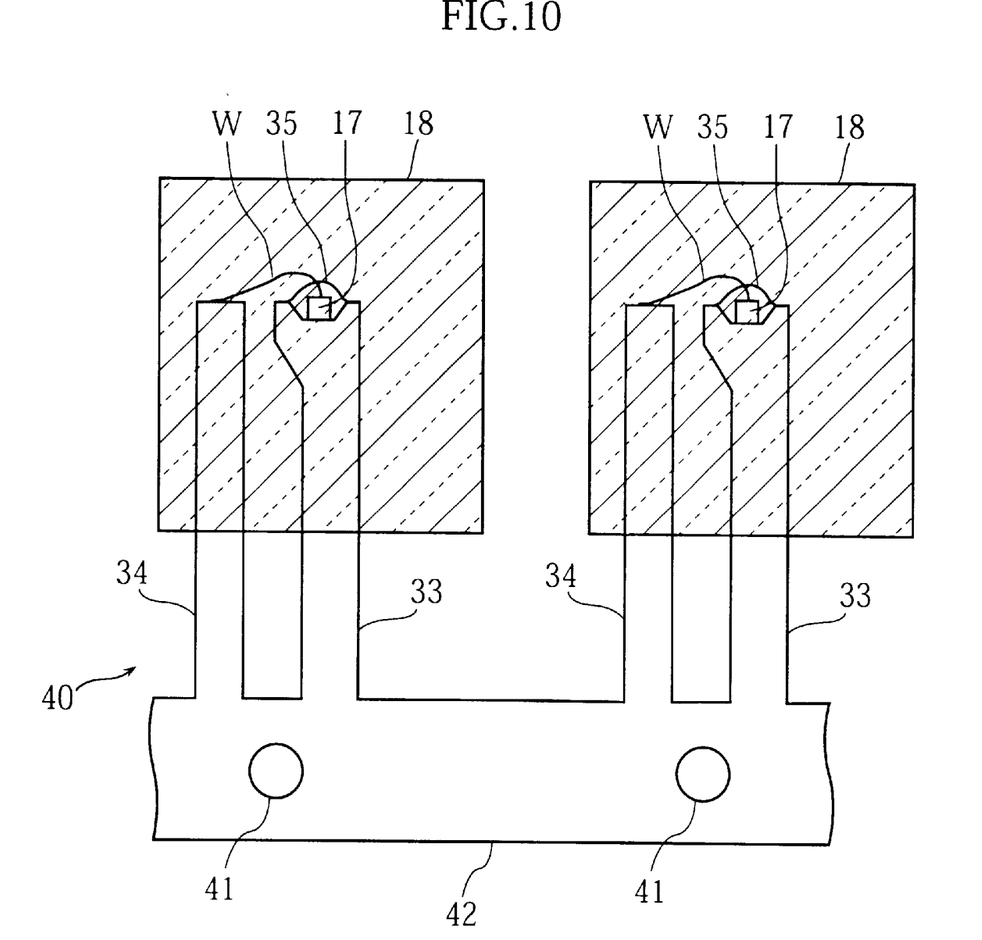

Then, as shown in FIG. 10, resin packages 18 are formed to enclose the respective light-emitting elements 17. To this end, use is made of a die which may consist of two molding members. Specifically, first, the conductive base 40 is sandwiched between the two molding members. These molding members define inner spaces corresponding to the packages 18 to be made. A transparent resin material (such as epoxy) in a molten state is poured into the inner spaces. The applied material is solidified, and then the two molding members are removed.

Then, though not shown in the figures, the first and second leads 33, 34 are cut off the side band 42 of the conductive base 40. Thus, a number of light-emitting units 13 are obtained.

As readily understood, the light-receiving unit 14 (see FIG. 2) can be obtained in the same manner.

A pair of light-emitting unit 13 and light-receiving unit 14 is fitted into a casing 12 (see FIGS. 1 and 2), to provide a photo-interrupter 10.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method of making an optical unit comprising the steps of:

forming a first lead and a second lead from a conductive member having a uniform thickness;

forming a dent in the first lead, the dent having a bottom surface and a side surface;

placing an optical element on the bottom surface of the dent;

connecting the optical element to the second lead by a wire;

forming a transparent protector for covering the optical element; and forming a resin package for covering the first and the second leads, the wire and the protector;

wherein the optical element having an upper surface and a bottom surface opposite to the upper surface; and the dent is formed with an opening in a first direction in which the upper surface of the optical element is directed, and the dent is formed with an opening in a second direction perpendicular to the first direction.

2. The method according to claim 1, wherein the dent is formed by subjecting the first lead to coining.

3. An optical unit comprising:

an optical element having an upper surface and a bottom surface opposite to the upper surface;

a lead including an end surface, the end surface being formed with a dent in which the optical element is placed; and a protector enclosing the optical element;

wherein the dent including both a bottom surface supporting the bottom surface of the optical element and a side surface connected to the bottom surface, the dent having an opening in a first direction in which the upper surface of the optical element is directed and an opening in a second direction perpendicular to the first direction.

4. The optical unit according to claim 3, wherein the bottom surface of the dent is greater in width than the end surface of the lead.

5. The optical unit according to claim 3, further comprising a resin package enclosing the protector.

6. The optical unit according to claim 3, wherein the bottom surface of the dent is flat and has a rounded outline.

7. The optical unit according to claim 3, wherein the side surface of the dent includes two slant portions facing each other, the slant portions being arranged to flare out as proceeding away from the bottom surface of the dent.

8. The optical unit according to claim 3, wherein the optical element includes a light-emitting surface perpendicular to the bottom surface of the dent.

9. The optical unit according to claim 3, further comprising an additional lead electrically connected to the optical element.

10. A photo-interrupter comprising:

a casing; and an optical unit accommodated in the casing, the optical unit including an optical element, a lead formed with a dent for placing the optical element in, and a protector enclosing the optical element;

the optical element having an upper surface and a bottom surface opposite to the upper surface; and the dent including a bottom surface supporting the bottom surface of the optical element and with a side surface connected to the bottom surface;

wherein the dent having an opening in a first direction in which the upper surface of the optical element is directed and an opening in a second direction perpendicular to the first direction.

* * * * *